(12) United States Patent
Prathapan et al.

(10) Patent No.: US 9,742,416 B2
(45) Date of Patent: Aug. 22, 2017

(54) IC PHASE DETECTOR WITH RE-TIMED REFERENCE CLOCK CONTROLLING SWITCHES

(75) Inventors: Indu Prathapan, Bangalore (IN); Krishnasawamy Nagaraj, Plano, TX (US); Frank Zhang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1026 days.

(21) Appl. No.: 13/397,551

(22) Filed: Feb. 15, 2012

(65) Prior Publication Data
US 2013/0211758 A1    Aug. 15, 2013

(51) Int. Cl.
G06F 19/00 (2011.01)
H03L 7/091 (2006.01)

(52) U.S. Cl.
CPC .......... H03L 7/091 (2013.01); *H03L 2207/50* (2013.01)

(58) Field of Classification Search
CPC ..... H03L 7/087; H03L 2207/50; H03L 7/095; H03L 7/091; H03L 7/093; H03L 7/099; H03L 7/107; H03L 2207/06; H03L 7/07; H03L 7/0814; H03L 7/23; G01R 13/029; G01R 13/345; G01R 19/2506; G04F 10/005; G04F 10/06; H04L 7/033
USPC .......... 327/147, 149, 156, 42, 159; 375/376, 375/220
See application file for complete search history.

(56) References Cited

U.S. PATENT DOCUMENTS

| | | | | |
|---|---|---|---|---|
| 4,720,687 A * | 1/1988 | Ostoich | ................... | H04L 7/033 327/42 |
| 7,973,578 B2 * | 7/2011 | Oh | ........................ | G04F 10/005 327/149 |
| 2005/0129099 A1 * | 6/2005 | Borker et al. | ................ | 375/220 |
| 2010/0073054 A1 * | 3/2010 | Bereza et al. | ................ | 327/159 |

OTHER PUBLICATIONS

"Retiming Sychronous Circuitry", Charles E. Leiserson and James Saxe. Algorithmica, 6, pp. 5-35 (1991).*

* cited by examiner

*Primary Examiner* — John H Le
(74) *Attorney, Agent, or Firm* — Lawrence J. Bassuk; Charles A. Brill; Frank D. Cimino (57) ABSTRACT

A phase detector includes a counter to generate the integer portion of a number of complete cycles of an output clock at each active edge of a reference clock. A time to digital converter in the phase detector generates the fractional portion of the number of complete cycles of the output clock at each active edge of the reference clock. The sum of the fractional portion and the integer portion is subtracted from an accumulated value obtained by accumulating a predetermined number to generate an error signal as the output of the phase detector. The counter is read at an active edge of one of two re-timed clocks derived from the reference clock. Each of the two re-timed clocks is generated based on a comparison of the fractional portion with a pair of thresholds. Errors due to metastability in reading the counter are thereby avoided.

10 Claims, 9 Drawing Sheets

IC PHASE DETECTOR WITH RE-TIMED REFERENCE CLOCK CONTROLLING SWITCHES

BACKGROUND

Technical Field

Embodiments of the present disclosure relate generally to electronic circuits, and more specifically to a method of reference clock re-timing scheme for use in electronic circuits.

Related Art

There are several electronic circuits or components in which a reference clock is used to perform an operation such as, for example, reading the contents of a register. Phase detectors and time-to-digital-converter-based analog to digital converters (ADC) are some examples of such electronic circuits.

Phase detectors are commonly used in phase locked loop (PLL) circuits to generate an error signal representing a phase difference between a reference clock and an output clock of the PLL. In one phase detector implementation, a digital phase detector (PD) generates the phase error by computing a difference between a reference phase and an estimated phase. The reference phase is represented by a pre-determined number that equals the number of cycles (including a fractional portion of a cycle) of the output clock expected at each active edge of the reference clock. The estimated phase is represented by a number measured as the actual number of cycles of the output clock measured at the corresponding active edges of the reference clock. The reference phase and the estimated phase are measured from the start of commencement of the phase detector operation.

Typically, the determination of the estimated phase involves reading, at a clock edge of the reference clock, a count value registered in a counter clocked by the output clock. The reference clock and the output clock may be asynchronous with respect to each other. Therefore, the counter may be updating its count value when being read at a clock edge of the reference clock, thereby potentially resulting in a wrong count value being read due to metastability issues. Similar metastability issues may arise in time-to-digital-converter-based ADCs as well.

A reference clock re-timing scheme refers to a technique for generating a phase-shifted reference clock (i.e., a re-timed reference clock) to perform the operations (e.g., reading the contents of a counter) otherwise performed by the non-retimed reference clock, and to thereby avoid the metastability issues noted above.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A phase locked loop (PLL) generates an error signal representing a phase difference between a reference clock and an output clock. Each of an integer portion and a fractional portion of a number of complete cycles of the output clock occurring at each active edge of the reference clock is determined. A magnitude of the fractional portion is compared with each of a first threshold and a second threshold, the first threshold representing a first fraction of one cycle of the output clock and the second threshold representing a second fraction of one cycle of the output clock. A first re-timed clock is selected to obtain the integer portion if the magnitude of the fractional portion is either less than or equal to the first threshold or greater than or equal to the second threshold. A second re-timed clock is selected to obtain the integer portion if the magnitude of the fractional portion is greater than the first threshold and less than the second threshold.

A phase detector for generating an error signal representing a phase difference between a reference clock and an output clock includes a counter, a fractional count determination circuit, and a pair of summing blocks. The counter is designed to generate a running count value representing an integer portion of a number of complete cycles of the output clock measured at each active edge of the reference clock. The fractional count determination circuit is designed to generate an output representing a fractional portion of the number of complete cycles of the output clock measured at each active edge of the reference clock. A first summing block in the pair of summing blocks adds the count value and the output of the fractional count determination circuit to generate a first number. A second summing block in the pair of summing blocks computes a difference of the first number and an accumulated value, the accumulated value representing the number of complete cycles of the output clock expected at each active edge of the reference clock. The counter is read at an active edge of a first re-timed clock to obtain the integer portion if the magnitude of the fractional portion is either less than or equal to a first threshold or greater than or equal to a second threshold. The counter is read at an active edge of a second re-timed clock to obtain the integer portion if the magnitude of the fractional portion is greater than the first threshold and less than the second threshold.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

Example embodiments will be described with reference to the accompanying drawings briefly described below.

The drawing in which an element first appears is indicated by the leftmost digit(s) in the corresponding reference number.

DETAILED DESCRIPTION

Various embodiments are described below with several examples for illustration.

1. Example Component

Figure 1:
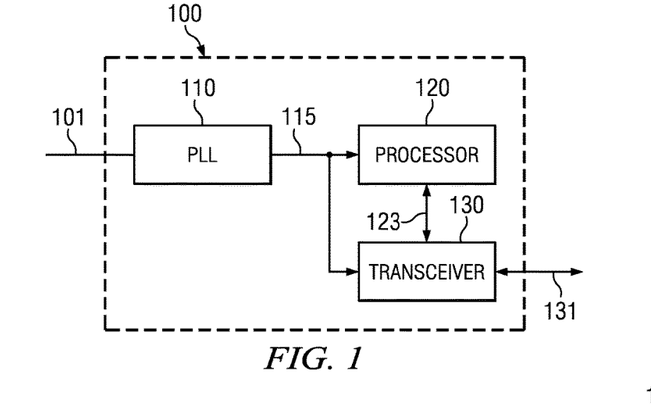
FIG. 1 is a block diagram illustrating the details of an example component in which several embodiments can be implemented.

FIG. 1 is a block diagram of an example component in which several embodiments of the present disclosure can be implemented. The diagram shows integrated circuit (IC) 100 containing phase locked loop (PLL) 110, processor 120 and transceiver 130. The specific blocks of IC100 are shown merely by way of illustration, and typical implementations of IC 100 may contain more or fewer blocks.

Processor 120 receives a clock on path 115. The operations of processor 120 may be synchronized with respect to clock 115. Processor 120 may generate data to be processed by transceiver 130, and provide the data to transceiver 130 on path 123. Processor 120 may receive data from transceiver 130 also on path 123. In general, processor 120 operates to provide various features designed to be provided by a system or device containing IC 100. When implemented in a wireless communications device, processor 120 may perform corresponding baseband processing operations.

Transceiver 130 may perform several operations to transmit modulated signals on and receive modulated signals from path 131. Accordingly, transceiver 130 may receive data from processor 120, modulate a carrier with the data, and transmit the modulated signal on path 131. Path 131 may be connected to an external antenna, which may then transmit the modulated signal on a wireless medium. Transceiver 120 may receive a modulated signal on path 131 (e.g., from a receive antenna), demodulate the signal, and forward the data obtained from the demodulation to processor 120. Transceiver 130 receives clock 115, and may generate various internal clocks derived from clock 115.

PLL 110 receives a reference clock 101, for example from an external source, and operates to phase-lock (align the phase of) output clock 115 with respect to the phase of reference clock 101.

Figure 2A:
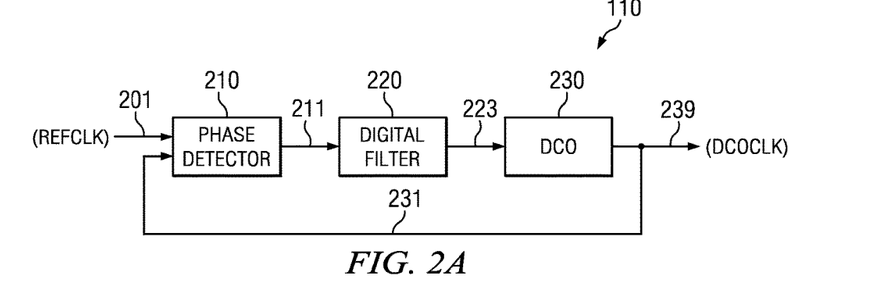
FIG. 2A is a diagram illustrating the block-level details of an ADPLL (All Digital Phase Locked Loop), in an embodiment.

FIG. 2A is a block diagram of PLL 110 in an embodiment. PLL 110 is shown implemented as an ADPLL (All-Digital Phase Locked Loop), and is shown containing phase detector 210, digital filter 220 and digitally controlled oscillator (DCO) 230. REFCLK 201 and DCOCLK 239 respective represent a reference clock provided to PLL 110 and an output clock of PLL 110.

Phase detector (PD) 210 receives REFCLK 201 (for example from an external source, not shown) and DCOCLK 239, and generates a number (digital code) representative of the phase error between the two clocks. PD 210 provides the digital code on path 211. Typically, REFCLK is at a lower frequency compared with DCOCLK. REFCLK and DCOCLK may be asynchronous with respect to each other.

Digital filter 220 performs low-pass filtering of digital codes received on path 211, and generates a filtered output (also a number) on path 223. Filtered output 223 controls the frequency of DCOCLK generated by DCO 230 on path 239. DCOCLK represents the output signal of PLL 110.

Figure 2B:
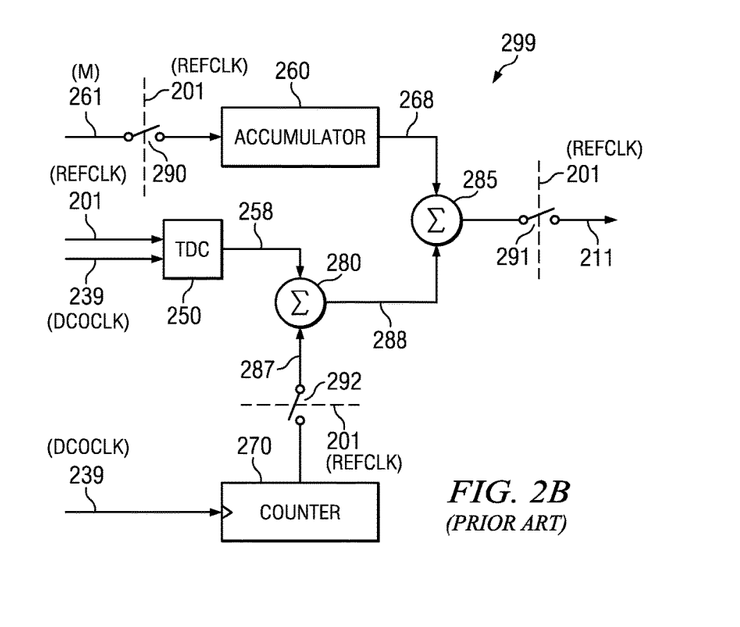
FIG. 2B is a diagram used to illustrate metastability problems associated with a phase detector used in an ADPLL.

FIG. 2B is a diagram used to illustrate metastability problems associated with a phase detector used in an ADPLL according to a prior technique. Phase detector 299 of FIG. 2B is shown containing time-to-digital converter (TDC) 250, accumulator 260, counter 270, switches 290, 291, 292 and summing/subtract blocks 280 and 285. Although not shown, additional logic circuitry may be implemented following TDC 250 to enable generation of the fractional part (noted below) on path 258.

Block 285 compares (by subtracting) the estimated phase value on path 288 (which represents the accumulated (or cumulative) number of complete (sum of integer and fractional) cycles of DCOCLK occurring in one cycle of REFCLK) with reference phase value 268. Value 268 represents the accumulated or cumulative value obtained in accumulator 260, wherein a pre-determined number (M) is added to the count value in accumulator 260 once every REFCLK period. The pre-determined number (M) represents the number of DCOCLK cycles expected (or which should ideally occur) in one cycle of REFCLK when REFCLK is in phase lock with DCOCLK, i.e., at a steady state (locked state) of PLL 110. M may either be an integer, or have both an integer as well as a fractional part.

With reference to FIG. 2B, the pre-determined number (M) is provided on path 261. The complete number of actual cycles of DCOCLK in one REFCLK may have an integer as well as a fractional part. To compute reference phase 268, the value 'M' provided on path 261 gets accumulated (i.e., added to the existing contents of accumulator 260) at every rising edge of the REFCLK. The value of 'M' is pre-computed and obtained by dividing frequency of DCOCLK by the frequency of REFCLK. Accumulator 260 accumulates the input (M) received on every rising edge of REFCLK. Thus, the reference phase 268 output by accumulator 260 at successive rising edges of REFCLK have respective values that are multiples of M, i.e., M, 2M, 3M, etc. Switch 290 is briefly closed at each rising edge of REFCLK to enable accumulation of M in accumulator 260.

REFCLK 201 controls the ON or OFF states of switches 290, 291 and 292. Counter 270, which may be implemented as a free-running counter, is incremented on every rising edge of DCOCLK. At each rising edge of REFCLK, switch 292 is closed briefly, and the count value in counter 270 is read onto path 287. The count value thus provided on path 287 represents the integer part of the 'estimated' phase. TDC 250 generates, on path 258, the fractional part of the 'complete' estimated phase 288. Summing block 280 adds the integer portion received on path 287 and the fractional part received on path 258 to generate the 'complete' estimated phase 288.

Summing block 285 subtracts the value of the complete estimated phase 288 from the reference phase on path 268.

The difference represents the phase error signal generated by PD 210, and is provided as a digital code on path 211 at every rising edge of REFLCK, switch 291 being briefly closed at each rising edge of REFCLK to enable provision of the error signal on path 211.

Accumulator 260 and counter 270 are linear and their contents can grow without bound as time progresses. Hence, accumulator 260 and counter 270 are implemented in modulo arithmetic to practically limit word-lengths of the arithmetic components used in phase detector 210. It is noted here that the contents of counter 270 and accumulator 260 may be reset to zero on commencement of operations of phase detector 299. Subsequently, counter 270 operates to increment its current count value at each DCOCLK active edge, and eventually flows over to start counting from zero again. Accumulator 260 adds the value M at each active edge of REFCLK, and eventually overflows. The difference, as generated by block 285, between the 'cumulative' values in accumulator 260 and counter 270 are thus always correctly representative of the difference in phase between REFCLK and DCOCLK. In other embodiments, counter 270 and accumulator 260 may instead be reset prior to start of each iteration (for example, every active edge of REFLCK), rather than operating with 'cumulative' counts. In yet other embodiments, accumulator 260 may not be implemented, and the value M may be directly provided to block 630, with counter 270 being reset prior to start of each iteration.

Figure 2C:
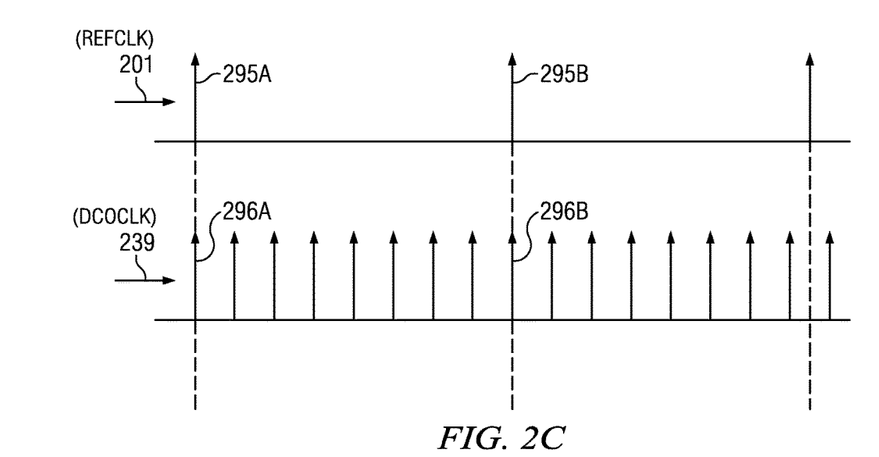
FIG. 2C is a diagram illustrating signal waveforms of some signals in a phase detector used in an ADPLL.

One potential cause of metastability in phase detector 299 is the asynchronous nature of DCOCLK and REFCLK with respect to each other, as illustrated with respect to FIG. 2C. Since REFCLK and DCOCLK are asynchronous with respect to each other, a rising edge of REFCLK may arrive at (or close) to a time instant when the value in counter 270 is changing in response to a rising edge of DCOCLK. In FIG. 2C, arrows shown against REFCLK represent the rising edges of REFCLK. Similarly, arrows shown against DCOCLK represent rising edges of DCOCLK. Rising edges 295A of REFCLK and 296A of DCOCLK are shown occurring (almost) at a same time instant. Similarly, rising edges 295B of REFCLK and 296B of DCOCLK are shown occurring (almost) at a same time instant.

Due to the possibility of the rising edges of REFCLK occurring at or near the rising edges of DCOCLK, the count value in counter 270 (read at every rising edge of REFCLK) may be changing to a new value (in response to a rising edge of DCOCLK), and therefore not be stable (due to setup or hold time violation, i.e., metastability) if latched by REFCLK directly. As a result, an indeterminate (and therefore a wrong) value may potentially be read from counter 270, and provided to summing block 280 (of FIG. 2B), thereby resulting in a wrong value of estimated phase 288, and consequently a wrong value of phase error as represented by the digital code provided on path 211. The use of such wrong phase error value may impede the acquire and track operations of PLL 110.

Embodiments of the present disclosure are directed to address the problem noted above, as described in detail next.

2. Reference Clock Re-timing

Figure 3A:
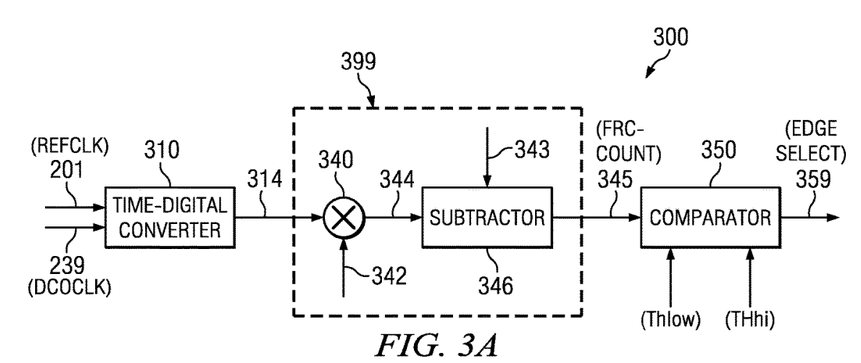
FIG. 3A is a diagram illustrating the various blocks used to enable the generation of a re-timed REFCLK, according to the present disclosure.

FIG. 3A is a diagram illustrating the various blocks used to enable the generation of a re-timed REFCLK to prevent metastability issues from occurring when counter 270 for DCOCLK is read. FIG. 3A shows circuit block 300 containing time-digital converter (TDC) 310, multiplier 340 and comparator 350.

TDC 310 receives REFCLK (201) and DCOCLK (239) as inputs, and generates, on path 314, a value (TDC-data) representative of the fractional delay difference between each of the REFCLK active edge and the previous active edge of DCOCLK.

In an embodiment, TDC 310 is implemented as a cyclic TDC, and is described in greater detail below with respect to FIG. 5A.

Multiplier 340 receives the TDC-data on path 314, and a digital value on path 342. The digital value on path 342 represents the inverse of the equivalent TDC-data value corresponding to one cycle of DCOCLK. The value on path 342 is referred to herein as (1/calibration-data). Multiplier 340 multiples TDC-data with (1/calibration-data) to generate a product on path 344. Subtractor 346 subtracts the product received on path 344 from the value one (1) received on path 343, i.e., subtractor 346 generates the difference [1−(value of product on path 344)], the difference (FRC-COUNT provided on path 345) representing the fractional portion of the complete number of DCOCLK cycles that is measured at each REFCLK active edge starting from the commencement of operations of phase detector 210. The combination of block 399 and TDC 310 is referred to herein as a "fractional count determination circuit".

Before describing the operation of comparator 350, it is now shown that the value of the fractional portion of a DCOCLK cycle at each REFCLK active edge can be used as a measure to determine whether the rising edge of REFCLK occurs close to the rising edge of DCOCLK or the falling edge of DCOCLK.

Figure 3B:
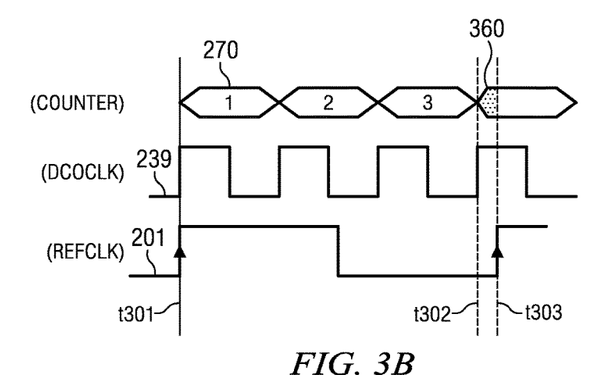
FIG. 3B is a timing diagram illustrating a scenario in which the rising edge of REFCLK occurs very close to the rising edge of DCOCLK.

FIG. 3B illustrates a scenario in which the rising edge of REFCLK occurs very close to the rising edge of DCOCLK. Interval t301-t303 represents one cycle of REFCLK, and is shown corresponding to three cycles plus some fraction of a cycle of DCOCLK. In FIG. 3B, a count value of three (from interval t301-t302) represents the number of integral (integer number of) cycles of DCOCLK (as measured by counter 270) in a cycle of REFCLK. Interval t302-t303 represents the fractional portion (360) of DCOCLK within the same REFCLK cycle (t301-t303). Fractional portion 360 (interval t302-t303) in FIG. 3B is very small compared to one cycle of DCOCLK.

Figure 3C:
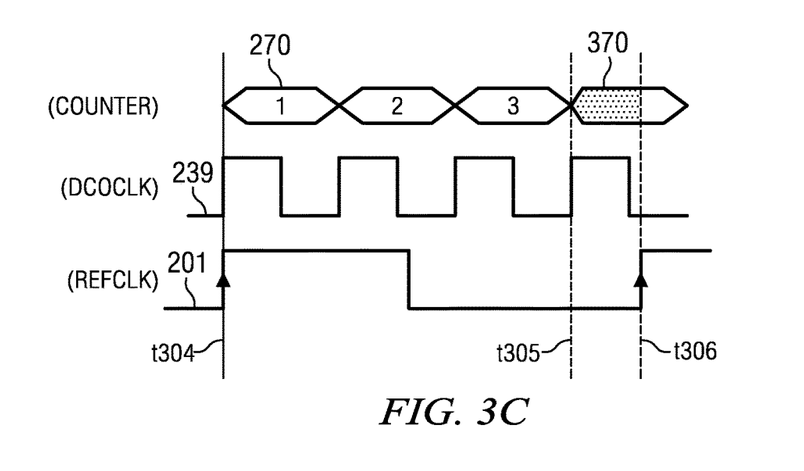
FIG. 3C is a timing diagram illustrating a scenario in which the rising edge of REFCLK occurs very close to the falling edge of DCOCLK.

FIG. 3C illustrates a scenario in which the rising edge of REFCLK occurs very close to the falling edge of DCOCLK. Interval t304-t306 represents one cycle of REFCLK, and is shown corresponding to three cycles plus some fraction of a cycle of DCOCLK. In FIG. 3C, a count value of three (from interval t304-t305) represents the number of integral cycles of DCOCLK (as measured by counter 270) in one cycle of REFCLK. Interval t305-t306 represents the fractional portion (370) of DCOCLK. Fractional portion 370 (interval t305-t306) in FIG. 3B is almost equal to half a cycle of DCOCLK.

Figure 3D:
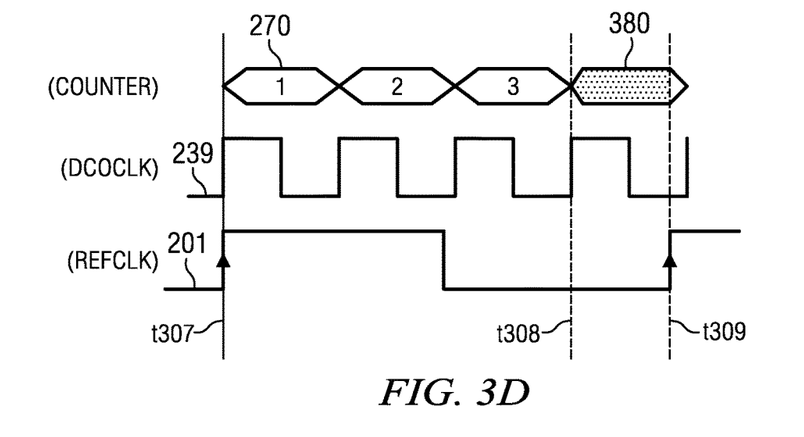
FIG. 3D is a timing diagram illustrating another scenario in which the rising edge of REFCLK occurs very close to the rising edge of DCOCLK.

FIG. 3D illustrates another scenario in which the rising edge of REFCLK occurs very close to the rising edge of DCOCLK. Interval t307-t309 represents one cycle of REFCLK, and is shown corresponding to three cycles plus some fraction of a cycle of DCOCLK. In FIG. 3D, a count value of three (from interval t307-t308) represents the number of integral cycles of DCOCLK (as measured by counter 270) in one cycle of REFCLK. Interval t308-t309 represents the fractional portion (380) of DCOCLK. Fractional portion 380 is almost equal to a full cycle of DCOCLK.

It may be observed that the value of the fractional portion is indicative of whether the rising edge of REFCLK occurs very close to the rising edge of DCOCLK or the falling edge of DCOCLK. In FIG. 3B, the value of the fractional part is very small (almost equal to zero DCOCLK). Hence it may be concluded that the rising edge of REFCLK occurs very close to the rising edge of DCOCLK. Such a timing relationship of REFCLK and DCOCLK may potentially result in metastability issues when the value of counter 270 is read, and it requires a 're-timed' REFCLK to be provided for reading counter 270. Similarly, as shown with respect to FIG. 3D, when the value of the fractional part is almost equal to (but less than) one DCOCLK cycle also, it may be concluded that the rising edge of REFCLK occurs very close to the rising edge of DCOCLK. In such a scenario again metastability issues can occur when the value of counter 270 is read, and a 're-timed' REFCLK needs to be provided for reading counter 270.

In FIG. 3C, the value of the fractional part is almost equal to half a cycle of DCOCLK. Hence, it may be concluded that the rising edge of REFCLK occurs very close to the falling edge of DCOCLK. Such a timing relationship of REFCLK and DCOCLK does not pose a metastability issue with respect to reading of counter 270 at rising edges of REFCLK.

Figure 3E:
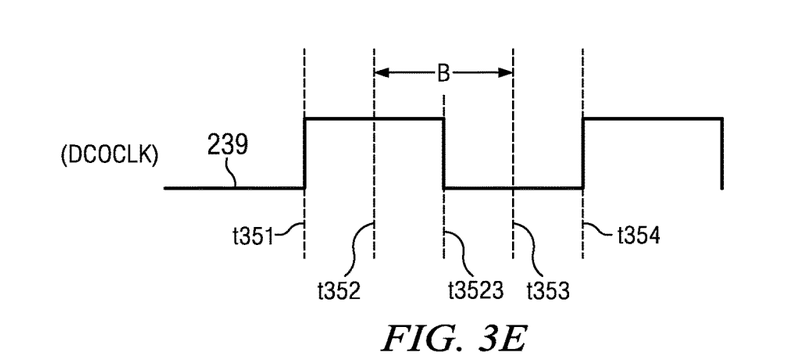
FIG. 3E is a diagram illustrating thresholds used in the comparator of FIG. 3A, in an embodiment.

FIG. 3E shows one cycle of DCOCLK. THlow and THhi are two predetermined thresholds that respectively equal the value of FRC-COUNT representing (or equal to) an interval within DCOCLK equal to interval t351-352 and interval t351-353.

Referring again to FIG. 3A, comparator 350 compares FRC-COUNT with THlow and THhi, and generates edge select signal 359 based on the following comparisons:

If FRC-COUNT is greater than THhi or less than THlow, then the rising edge of REFCLK falls either in interval t353-t354 or interval t351-t352, and therefore closer to a rising edge (occurring either at t351 or t354) of DCOCLK. Hence, comparator 350 generates signal 359 with a first logic level that selects signal 467 (described below with respect to FIG. 4A) as the 're-timed' clock.

If FRC-COUNT has a value lying between the values THlow and THhi, then the rising edge of REFCLK falls in region B (interval t352-t353), and therefore closer to the falling edge of DCOCLK (occurring at t3523). Hence, comparator 350 generates signal 359 with the inverse of the first logic level that selects signal 447 (described below with respect to FIG. 4A) as the 're-timed' clock.

As illustrated below with respect to FIG. 4A, edge select signal 359 is used as a control signal for the selection of a 're-timed' REFCLK signal.

3. Re-timing Circuit

Figure 4A:
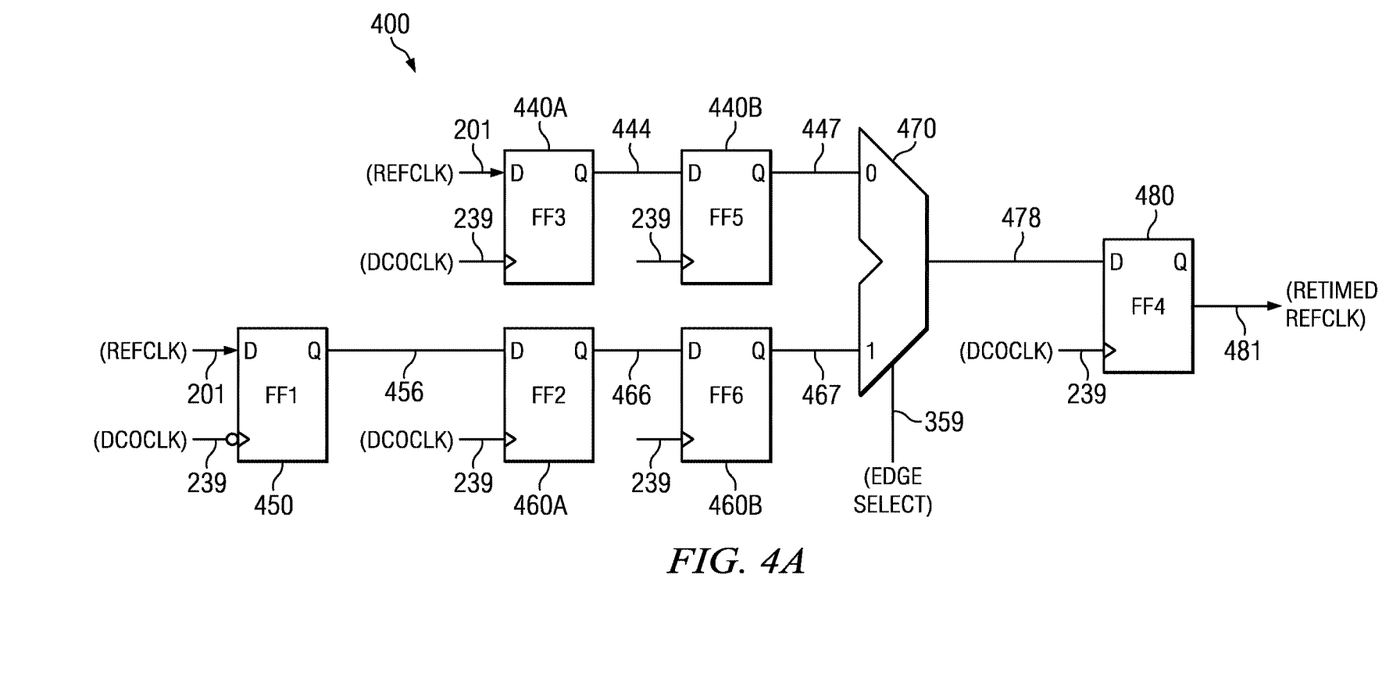
FIG. 4A is a diagram illustrating the details of a circuit used to implement reference clock re-timing, in an embodiment.

FIG. 4A is a diagram illustrating the details of a circuit used to implement reference clock re-timing in an embodiment. Re-timing circuit 400 is shown containing negative (or falling) edge triggered flip-flop FF1 (450), positive (or rising) edge triggered flip-flops FF2 (460A), FF3 (440A), FF4 (480), FF5 (440B), FF6 (460B), and multiplexer 470.

FF1 receives REFCLK as a data input (D) and stores the value of REFCLK at each negative edge of DCOCLK. FF1 provides the stored value (Q) of REFCLK on path 456. FF2 receives the signal on path 456 as a data input (D) and stores the value of signal 456 at each rising edge of DCOCLK. FF2 provides the stored value (Q) on path 466. FF6 receives the signal on path 466 as a data input (D) and stores the value of signal 466 at each rising edge of DCOCLK. FF6 provides the stored value (Q) on path 467.

FF3 receives REFCLK as a data input (D) and stores the value of REFCLK at each rising edge of DCOCLK. FF3 provides the stored value (Q) of REFCLK on path 444. FF5 receives the signal on path 444 as a data input (D) and stores the value of signal 444 at each rising edge of DCOCLK. FF5 provides the stored value (Q) on path 447.

Multiplexer 470 receives each of signals 447 and 467 as inputs, and forwards one of signals 447 and 467 on path 478 based on the value of edge select signal 359. Edge select signal 359 is generated by circuit block 300, as described above. FF4 stores the value of signal 478 (received as a data input (D)) at each rising edge of DCOCLK. FF4 provides the stored value (Q) on path 481. Signal 481 represents a 're-timed' REFCLK that can be used (instead of REFCLK itself) to sample the count value in a counter without causing metastability issues.

Figure 4B:
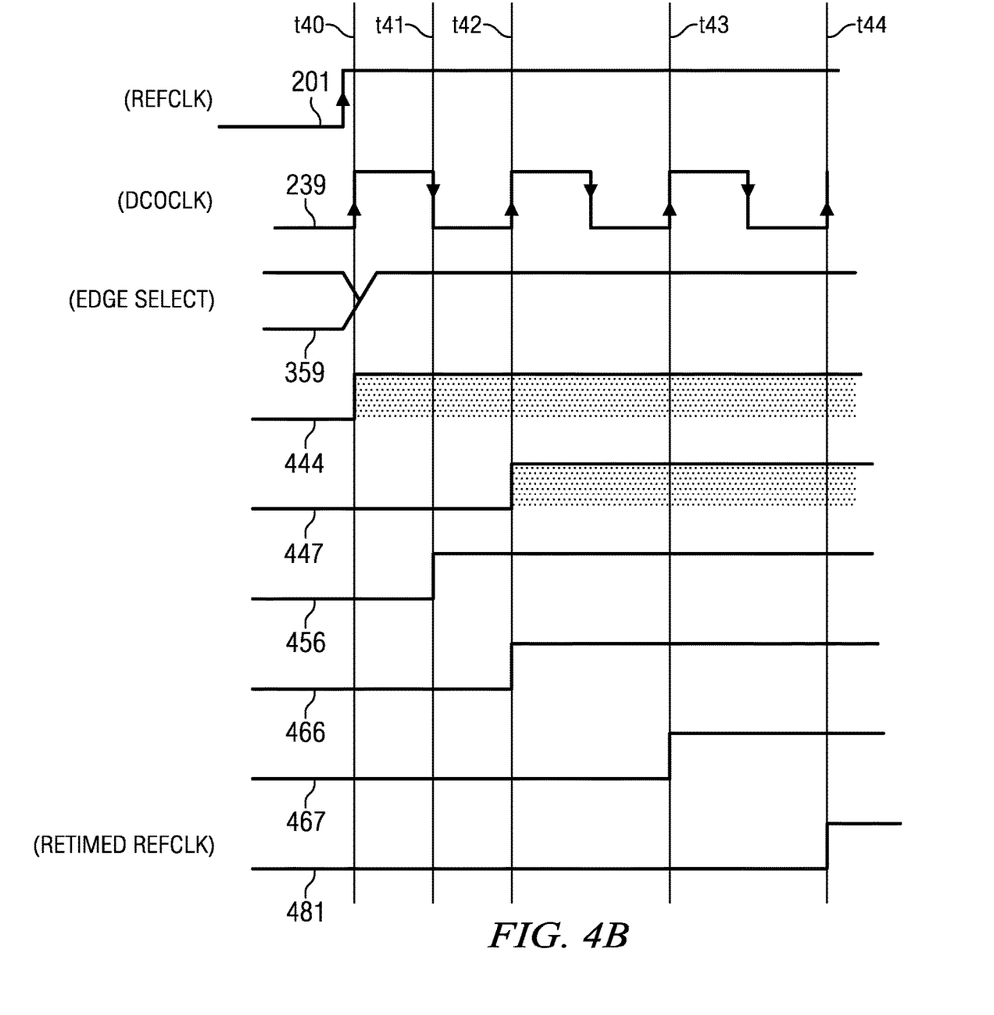
FIGS. 4B, 4C and 4D are timing diagrams illustrating the waveforms of some of the signals of FIG. 4A for different scenarios.

When the rising edge of REFCLK occurs very close to a rising edge of DCOCLK, then edge select 359 forwards signal 467 on path 478. The corresponding signal waveforms of circuit 400 are shown in FIG. 4B, in which the rising edge of REFCLK is shown as occurring slightly earlier than a rising edge of DCOCLK. Edge select 359 transitions to logic high at t40. DCOCLK switches to logic high at t40. REFCLK is shown as transitioning to logic high slightly earlier than t40, and less than a setup time of FF3 from the rising edge of DCOCLK at t40. As a result, output 444 of FF3 is potentially indeterminate starting from t40, as indicated by the shaded portion of waveform 447. Since signal 444 is indeterminate, output 447 of FF5 is also potentially indeterminate starting from t42. Typically though, the indeterminate states may last only for a few cycles of DCOCLK. Output 456 of FF1, on the other hand, is valid and at logic high at t41. Signal 466 switches to logic high at t42. Signal 467 switches to logic high at t43, and is forwarded as signal 478. Signal 478 (or signal 467) is forwarded as re-timed REFCLK 481 at t44.

Figure 4C:
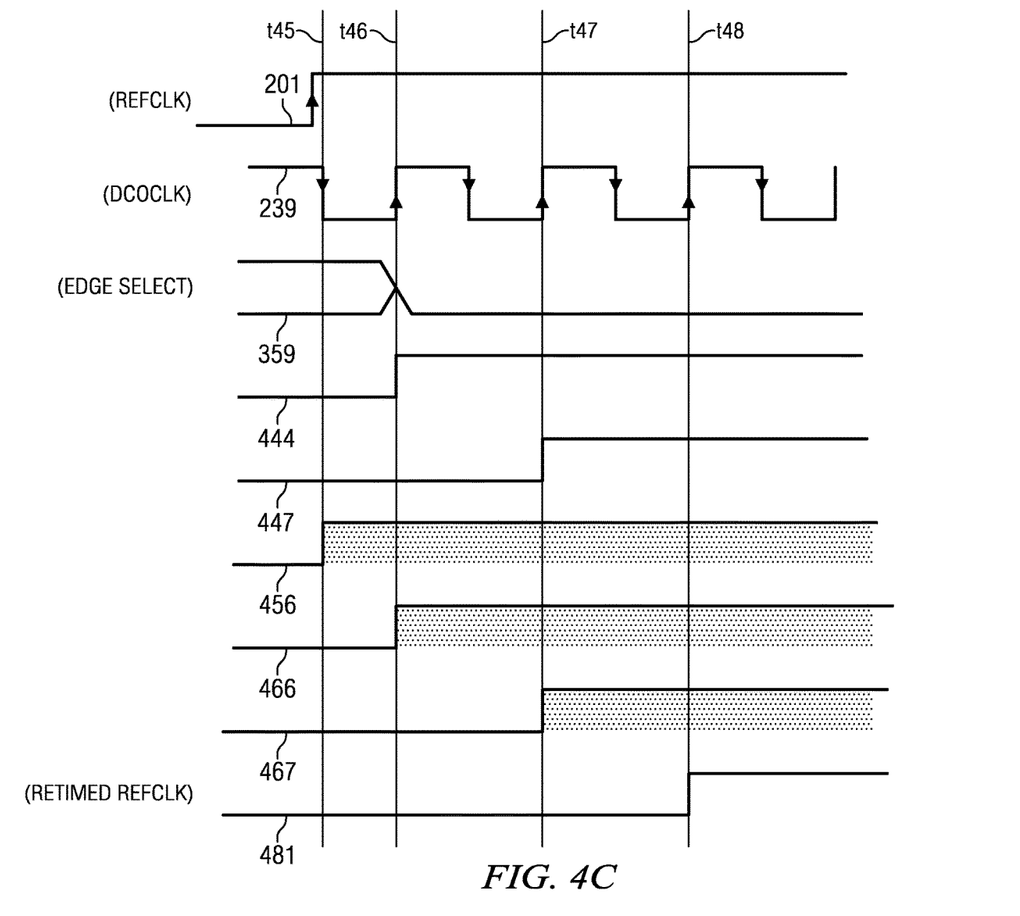
Figure 4D:
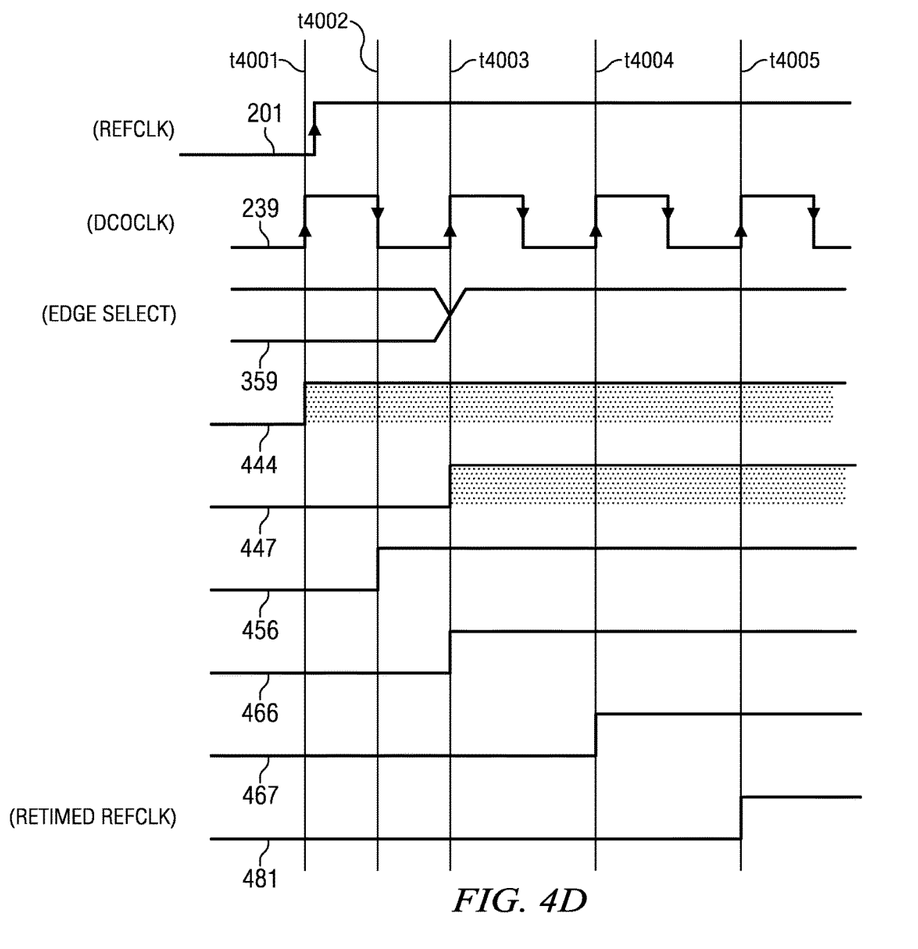

FIG. 4D illustrates a scenario in which the rising edge of REFCLK occurs slightly later than a rising edge of DCOCLK. Edge select 359 transitions to logic high at t4003. DCOCLK switches to logic high at t4001. REFCLK is shown as transitioning to logic high slightly later than t4001, and less than a hold time of FF3 from the rising edge of DCOCLK at t4001. As a result, output 444 of FF3 is potentially indeterminate. Similarly, output 447 of FF5 is also potentially indeterminate as indicated by the shaded portion of waveform 447. Typically though, the indeterminate states may last only for a few cycles of DCOCLK. Output 456 of FF1, on the other hand, is valid and at logic high at t4002. Signal 466 switches to logic high at t4003. Signal 467 switches to logic high at t4004, and is forwarded as signal 478. Signal 478 (or signal 467) is forwarded as re-timed REFCLK 481 at t4005.

When the rising edge of REFCLK occurs very close to a falling edge of DCOCLK, then edge select 359 forwards signal 447 on path 478. The corresponding signal waveforms of circuit 400 are shown in FIG. 4C. Edge select 359 transitions to logic low at t46. DCOCLK switches to logic low at t45. REFCLK is shown as transitioning to logic high slightly earlier than t45, and less than a setup time of FF1 from the falling edge of DCOCLK at t45. As a result, output 456 of FF1 is potentially indeterminate starting from t45, as indicated by the shaded portion of waveform 456. Signal 466 and 467 transition at t46 and t47 respectively, and may also be indeterminate as indicated by the corresponding shaded portions. Typically though, the indeterminate states of signals 456, 466 and 467 may last only for a few cycles of DCOCLK. Output 444 of FF3, on the other hand, is valid and at logic high at t46. Output 447 of FF5 transitions to logic high at t47, and is forwarded as signal 478. Signal 478 (or signal 447) is forwarded as re-timed REFCLK 481 at t48.

Thus, signal 447 (second re-timed clock) is provided as re-timed REFCLK (481) if FRC-COUNT (signal 345 of FIG. 3A) is greater than THlow and less than THhi. On the other hand, Signal 467 (first re-timed clock) is provided as re-timed REFCLK (481) if FRC-COUNT is either less than THlow or greater than THhi.

4. Time to Digital Converter

Figure 5A:
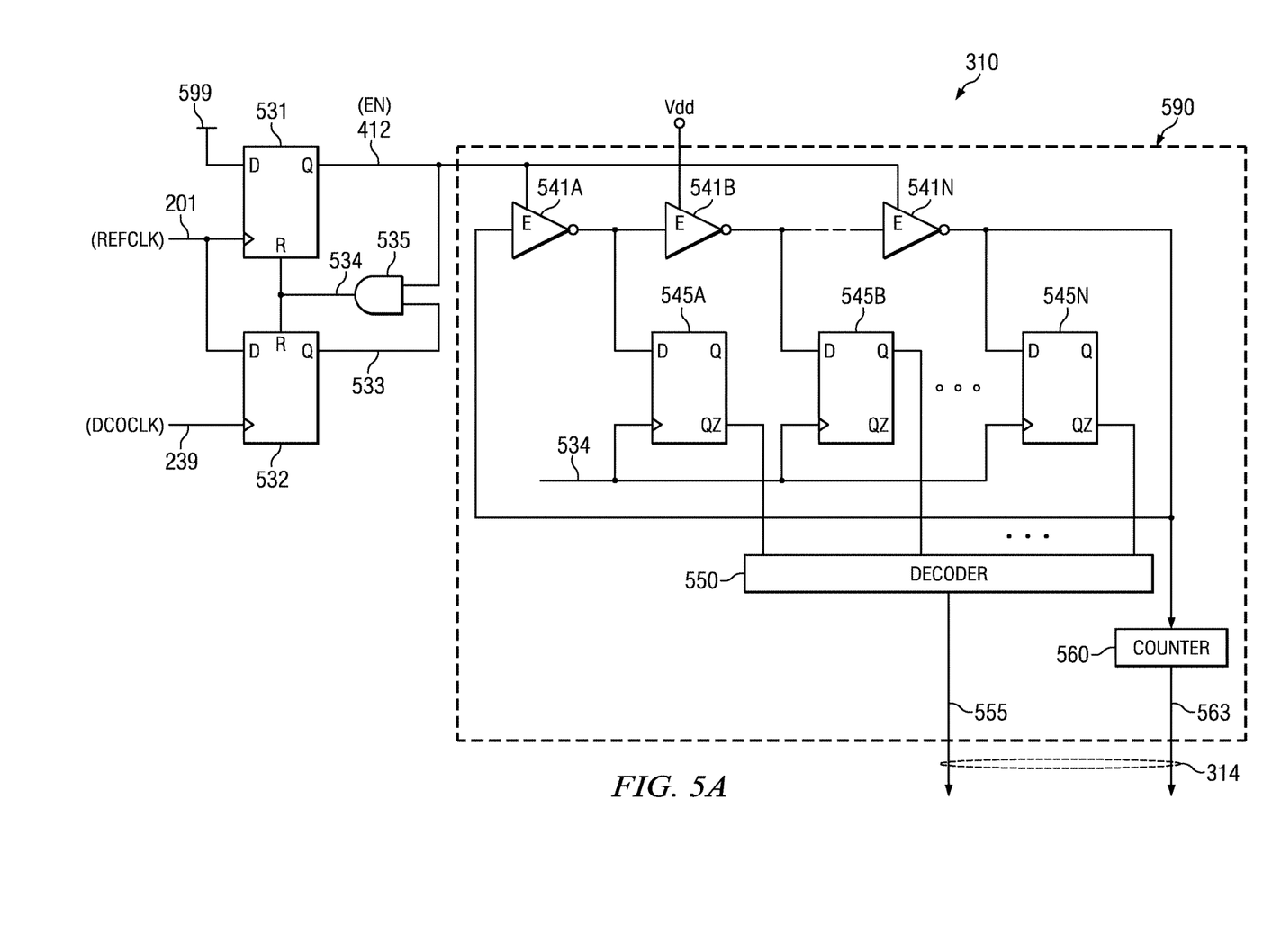
FIG. 5A is a diagram illustrating the implementation details of a cyclic TDC 310 in an embodiment.

FIG. 5A is a diagram illustrating the implementation details of TDC 310 in an embodiment. TDC 310 of FIG. 5A is shown containing flip-flops 531 and 532, AND gate 535, inverters 541A through 541N, latches 545A through 545N, decoder 550 and counter 560. As noted above, TDC 310 receives REFCLK and DCOCLK as inputs, and generates a number (TDC-data) representing the fractional delay difference between each REFCLK active edge and the corresponding previous active edge of DCOCLK. Block 590, shown containing inverters 541A through 541N, latches 545A through 545N, decoder 550 and counter 560, is referred to herein as a "pulse-width measurement block".

The data input (D) of flip-flop 531 is connected to a power supply (599) and is therefore permanently at logic high. Flip-flop 531 provides a logic high on output path 412 in response to a rising edge of REFCLK, provided signal 534 connected to its reset input (R) is not asserted. When signal 534 connected to the reset input (R) of flip-flop 532 is not asserted, flip-flop 532 provides on output path 533 the logic value of REFCLK in response to each rising edge of DCOCLK. AND gate 535 generates on path 534 a logical AND of signals 412 and 533. Signal 534 is connected to the reset inputs (R) of each of flip-flops 531 and 532.

Figure 5B:
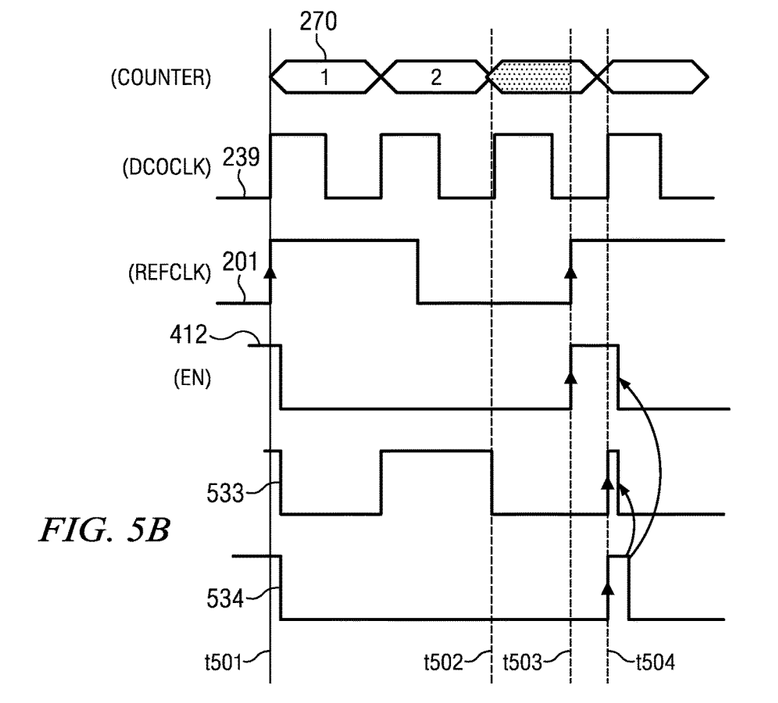
FIG. 5B shows a timing diagram illustrating the generation of TDC-data.

Referring now to the timing diagram of 5B, interval t501-t503 represents one cycle of REFCLK, and is shown corresponding to two cycles plus some fraction (interval t502-t503) of a cycle of DCOCLK. At the rising edge of REFCLK occurring at t503, signal 412 (EN) goes to logic high. At the rising edge of DCOCLK occurring at t504, signal 533 goes to logic high. Consequently, reset signal 534 is asserted high, and resets signals 412(EN) and 533 to logic zero (as indicated in FIG. 5B by the corresponding arrows). In response to both of signals 412(EN) and 533 being reset to logic zero, reset signal 534 also switches to logic zero. The difference of the width (interval t503-t504) of EN signal 412 and one clock period of DCOCLK equals the fractional portion (t502-t503) of a cycle of DCOCLK at each REFCLK active edge. Thus, the width of signal 412 (EN) may be viewed as representing the fractional portion, since the clock period of DCO clock can be determined. In an embodiment, the TDC-data value corresponding to one DCO clock period is determined during initial calibration. Block 590 of TDC 310 (shown in FIG. 5A) is supplied with a pulse (instead of EN) whose logic high duration corresponds to one DCO clock period and the corresponding TDC-data (314) is saved as calibration-data.

Due to propagation delays, the width of signal 412 (EN) may be slightly larger than the ideal width if propagation delays were not present. However, such error may be negligible compared to the clock period of DCOCLK.

Inverters 541A through 541N of FIG. 5A are configured to form a gated ring oscillator (GRO). Numbering inverters 541A through 541N as 1 through N, each of the even-numbered inverters (e.g., 541B, 541D, etc) in the GRO have their respective enable (E) terminals tied to a constant logic 'high', while each of the odd-numbered inverters (e.g., 541A, 541C, etc) have their respective enable (E) terminals connected to signal 412 (EN). In FIG. 5A, the (E) terminals of inverters 541A and 541N (with N assumed to be an odd number, such as for example, 15) are shown connected to signal 412 (EN), while the (E) terminal of inverter 541B is shown connected to logic high (Vdd). The (E) terminals of the inverters not shown in FIG. 5A are connected as noted above.

The number of inverters forming the GRO is always an odd number, with the specific number chosen to ensure oscillation of the ring oscillator. Counter 560 is designed to be fast enough to handle the oscillation frequency of the ring oscillator. In an embodiment, the number of inverters used to form the ring oscillator is fifteen. Signal 412 (EN), when at logic high, activates (enables) the odd-numbered inverters (541A, 541C, 541E, etc, as noted above). The even-numbered inverters (e.g., 541B, 541D, etc) are always enabled, as also noted above. The output of each inverter in the ring oscillator is stored in a respective one of latches 545A through 545N, when signal 534 is at logic high.

Numbering latches 545A through 545N as one (1) through fifteen (15) respectively (N being equal to 15 in the embodiment), the Q outputs of each of the even-numbered latches in the fifteen latches are provided as inputs to thermometric decoder 550. The QZ outputs (QZ being the logical inverse of the corresponding Q output) of each of the odd-numbered latches in the fifteen latches are provided as inputs to decoder 550. Thus, as shown, the QZ output of latch one (545A) is provided to decoder 550, while the Q output of latch two (545B) is provided to decoder 550.

Decoder 550 operates to generate an output value on path 555, with the output value representing the four LSBs (least significant bits) of TDC-data 314. Counter 560 receives the output of the fifteenth inverter (541N), and generates the upper three MSB (most significant bits) 563 of TDC-data 314. Thus, the outputs on paths 555 and 563 together represent TDC-data 314 (FIG. 3A), which in an embodiment is thus a seven-bit value. The operation of block 590 in generating a number representing the fractional portion is briefly illustrated next.

When EN (412) is at logic low, the outputs of all the odd-numbered inverters (whose respective enable inputs are connected to EN) are disabled and hence pulled high (via an internal pull-up, not shown in FIG. 5A). The even-numbered inverters are always enabled, and respectively receive a logic one from the corresponding immediately previous (odd-numbered) inverter. As a result, the output of each of the even-numbered inverter is a logic zero. Thus, when EN is at logic low, and with N equaling 15, the initial state (prior to the logic low-to logic high transition of sign 412 (EN)) of the inverter chain is "101010101010101" (binary).

Once signal 412 (EN) transitions to logic high, all of inverters 541A through 541N are enabled, and the GRO is free to oscillate. Assuming for example that the width of EN is 80 picoseconds (ps), and the delay in each inverter is 20 ps, by the time EN transitions from logic high back to logic low, the first four of the inverters, i.e., inverters 541A through 541D, would have toggled. As a result, the 15-bit output of the inverter-chain when sampled by signal 534 would be "010110101010101". The outputs of latches 545A-545N, would therefore correspond to "111100000000000" (binary). In general, the number of '1's in the binary string provided as input to thermometric decoder 550 is proportional to the width of EN.

Since the inverters 541A through 541N are operational only during the interval in which signal 412 (EN) is high, power consumption of the ring oscillator may not be significant. Further, only as many inverters as necessary to enable oscillation need be implemented in TDC 310, thereby potentially lending to savings in implementation area.

Figure 6:
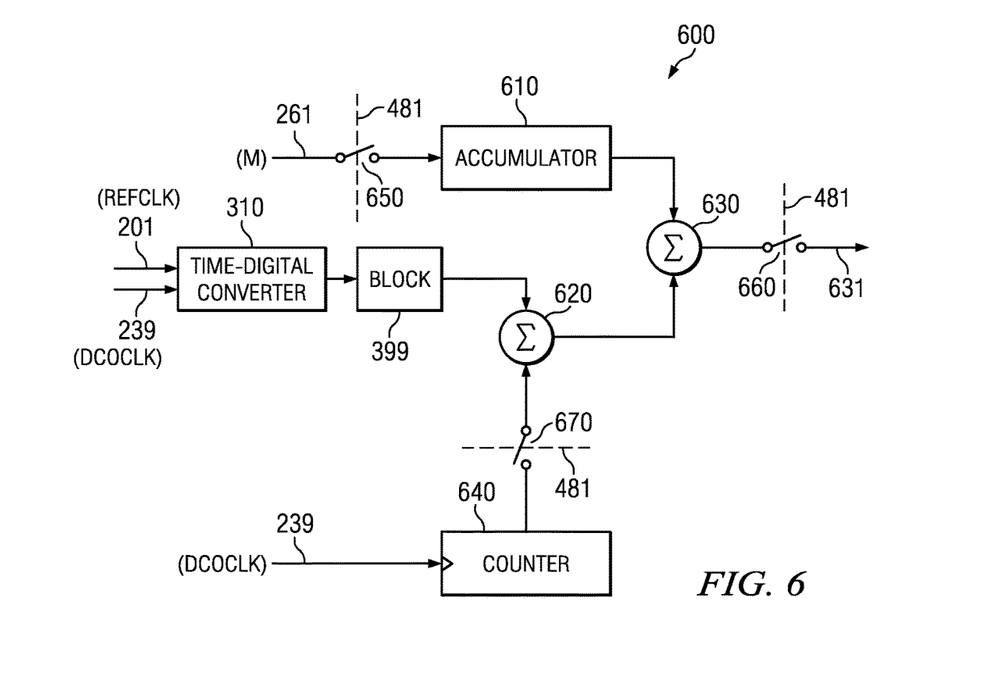
FIG. 6 is a block diagram of an implementation of a phase detector that uses a re-timed reference clock, in an embodiment.

FIG. 6 is a block diagram of an implementation of a phase detector in an embodiment. Phase detector 600, which can be implemented in place of phase detector 210 of FIG. 2A is shown containing TDC 310, block 399, accumulator 610, counter 640, switches 650, 660 and 670, and summing blocks 620 and 630. Although not shown in FIG. 6, phase detector 600 is assumed to additionally include comparator 350 (with the corresponding circuit connections) of FIG. 3A, as well as re-timing circuit 400 (with the corresponding circuit connections) of FIG. 4A. As noted above, the combination of TDC 310 and block 399 is a fractional count determination circuit.

Accumulator 610, counter 640, and summing blocks 620 and 630 operate identically to accumulator 260, counter 270, and summing blocks 280 and 285 respectively of FIG. 2B, and their description is not repeated here in the interest of brevity. The operation of block 399 is described above with respect to FIG. 3A. Signals 261(M), REFCLK, and DCO-CLK are the same as correspondingly named signals of FIG. 2B. Signal 631 corresponds to error signal 211.

Each of switches 650, 660 and 670 is operated by re-timed reference clock 481. As a result, errors in phase error 611, which might otherwise have occurred (due to metastability issues in the reading of counter 640 if counter 640 were read based on REFCLK), are prevented from occurring. Consequently, acquire and track operations of PLL 110 are not affected due to metastability-induced errors. It may be appreciated that the selection of the appropriate re-timed reference clock (i.e., the appropriate one of clocks 447 and 467) may be performed every REFCLK period. Thus, the appropriate one of clocks 467 and 447 is forwarded as retimed REFCLK 481 for each sampling of counter 640 via switch 670.

While the circuits of FIGS. 3A, 4A, and 5A are noted as being contained within phase detector 210, the circuits may also be implemented external to phase detector 600, with only re-timed REFCLK 481 being provided as an input to phase detector 600. Further, while in the illustrations of FIGS. 2A, 3A, 4A, 5A and 6, although terminals/nodes are shown with direct connections to various other terminals, it should be appreciated that additional components (as suited for the specific environment) may also be present in the path, and accordingly the connections may be viewed as being electrically coupled to the same connected terminals. In the instant application, power and ground terminals are referred to as constant reference potentials.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. An integrated circuit comprising:
  A. a reference clock signal lead;
  B. digitally controlled oscillator circuitry having a filtered input and a digitally controlled oscillator clock output lead;
  C. digital filter circuitry having a phase error signal input and a filtered output lead connected to the filtered input;
  D. phase detector circuitry having a reference clock input connected to the reference clock signal lead, a digitally controlled oscillator clock input connected to the digitally controlled oscillator clock output lead, and a phase error signal output lead connected to the phase error signal input, the phase detector circuitry including a first switch having an input, an output coupled to the phase error signal output lead, and a re-timed reference clock control input;
  E. re-timing circuitry having a reference clock input connected to the reference clock signal lead, a digitally controlled oscillator clock input directly connected to the digitally controlled oscillator clock output lead, an edge select signal input, and a re-timed reference clock signal output lead connected to the re-timed reference clock control input of the first switch; and
  F. edge select circuitry having an input connected to the reference clock signal lead, an input connected to the digitally controlled oscillator clock output lead, and an edge select signal output coupled to edge select signal input.

2. The integrated circuit of claim 1 in which the phase detector circuitry includes an certain value M input lead, a reference phase value accumulator having a reference value input, and a reference phase value output coupled to the input of the first switch, and a second switch having an input coupled to the certain value M input lead, an output coupled to the reference value input, and a control input coupled to the re-timed reference clock control signal output lead.

3. The integrated circuit of claim 1 in which the phase detector circuitry includes counter circuitry having an input coupled to the digitally controlled oscillator clock output lead and a counter output, and includes a third switch having an input coupled to the counter output, an output coupled to the phase error signal output lead, and a control input coupled to the re-timed reference clock control signal output lead.

4. The integrated circuit of claim 1 in which the phase detector circuitry includes:
  an certain value M input lead;
  a reference phase value accumulator having a reference value input coupled to the certain value M input lead, and a reference phase value output; and
  output summing circuitry having an input connected to the reference phase value output and an output coupled to the input of the first switch.

5. The integrated circuit of claim 1 in which the phase detector circuitry includes:
  counter circuitry having an input connected to the digitally controlled oscillator clock output lead and an integer signal output;
  time to digital converter circuitry having an input connected to the reference clock signal lead, an input connected to the digitally controlled oscillator clock output lead, and a fractional signal output; and
  estimated summing circuitry having an input connected to the integer signal output, an input connected to the fractional signal output, and an estimated phase value output coupled to the input of the first switch.

6. The integrated circuit of claim 1 in which the phase detector circuitry includes:
  an certain value M input lead;
  a reference phase value accumulator having a reference value input coupled to the certain value M input lead, and a reference phase value output;
  output summing circuitry having a reference input connected to the reference phase value output, an estimated input, and an output coupled to the input of the first switch;
  counter circuitry having an input connected to the digitally controlled oscillator clock output lead and an integer signal output;

time to digital converter circuitry having an input connected to the reference clock signal lead, an input connected to the digitally controlled oscillator clock output lead, and a fractional signal output; and estimated summing circuitry having an input connected to the integer signal output, an input connected to the fractional signal output, and an estimated phase value output connected to the estimated input.

7. The integrated circuit of claim 1 in which the edge select circuitry includes fractional count determining circuitry having an input coupled to the reference clock signal lead, an input coupled to the digitally controlled oscillator clock output lead, a threshold high input, a threshold low input, and the edge select signal output.

8. The integrated circuit of claim 1 in which the edge select circuitry includes:

time-digital converter circuitry having an input coupled to the reference clock signal lead, an input coupled to the digitally controlled oscillator clock output lead, and a time-digital signal output;

a multiplier having an input coupled to the time-digital signal output, a 1/calibration data input, and a product output;

subtractor circuitry having an input coupled to the product output, a "1" value input, and a fractional count output; and comparator circuitry having an input coupled to the fractional count output, a threshold high input, a threshold low input, and the edge select signal output.

9. The integrated circuit of claim 1 in which the re-timing circuitry includes:

a first set of circuits having a reference clock input coupled to the reference clock signal lead, a digitally controlled oscillator clock input coupled to the digitally controlled oscillator clock output lead, and a first output;

a second set of circuits having a reference clock input coupled to the reference clock signal lead, a digitally controlled oscillator clock input coupled to the digitally controlled oscillator clock output lead, and a second output;

a multiplexer having an input coupled to the first output, an input coupled to the second input, a control input coupled to the edge select signal input, and an output; and a timing circuit having an input coupled to the output of the multiplexer, an input coupled to the digitally controlled oscillator clock input, and the re-timed reference clock signal output lead.

10. The integrated circuit of claim 9 in which the first set of circuits are D-type flip flops coupled in series and the second set of circuits are D-type flip flops coupled in series.

* * * * *